United States Patent
Asano

(10) Patent No.: US 8,669,922 B2
(45) Date of Patent: Mar. 11, 2014

(54) IMAGE DISPLAY PANEL, IMAGE DISPLAY DEVICE, AND MANUFACTURING METHOD OF THE IMAGE DISPLAY PANEL

(75) Inventor: Mitsuru Asano, Kanagawa (JP)

(73) Assignee: Sony Corporation, Tokyo (JP)

( * ) Notice: Subject to any disclaimer, the term of this patent is extended or adjusted under 35 U.S.C. 154(b) by 829 days.

(21) Appl. No.: 12/637,294

(22) Filed: Dec. 14, 2009

(65) Prior Publication Data

US 2010/0149077 A1 Jun. 17, 2010

(30) Foreign Application Priority Data

Dec. 15, 2008 (JP) ................................ P2008-318270

(51) Int. Cl.
*G09G 3/30* (2006.01)
(52) U.S. Cl.
USPC ................................ 345/76; 345/81; 345/207
(58) Field of Classification Search
USPC .................. 345/42, 76, 80, 81, 100, 207, 214
See application file for complete search history.

(56) References Cited

U.S. PATENT DOCUMENTS

| | | | |
|---|---|---|---|
| 2006/0022206 A1 | 2/2006 | Hayakawa et al. | |
| 2006/0139254 A1* | 6/2006 | Hayakawa et al. | 345/76 |
| 2007/0285411 A1* | 12/2007 | Yang et al. | 345/207 |

FOREIGN PATENT DOCUMENTS

| | | |
|---|---|---|
| JP | HEI 11-109918 | 4/1999 |
| JP | 2006-011388 | 1/2006 |
| JP | 2006-11388 | 1/2006 |
| JP | 2006-186324 | 7/2006 |
| JP | 2007-156044 | 6/2007 |

OTHER PUBLICATIONS

Japanese Office Action dated Nov. 30, 2010, for corresponding Japanese Appl. No. 2008-318270.
JP Office Action for corresponding Japanese Patent Application No. 2008-318270 dated Aug. 23, 2011.

* cited by examiner

*Primary Examiner* — Joseph Feild
*Assistant Examiner* — Andrew Sasinowski
(74) *Attorney, Agent, or Firm* — K&L Gates LLP

(57) ABSTRACT

An image display panel includes: a lower substrate; self-light emitting elements for image display that are arranged on the lower substrate in a matrix shape and form an image display unit; a self-light emitting element for monitoring that is arranged on the lower substrate and emits monitoring light for the image display unit; and an upper substrate that holds the self-light emitting elements for image display and the self-light emitting element for monitoring in conjunction with the lower substrate, wherein the self-light emitting elements for image display emit emission light to the lower substrate side or the upper substrate side, and the self-light emitting element for monitoring emits the monitoring light to at least the upper substrate side or the lower substrate side.

15 Claims, 12 Drawing Sheets

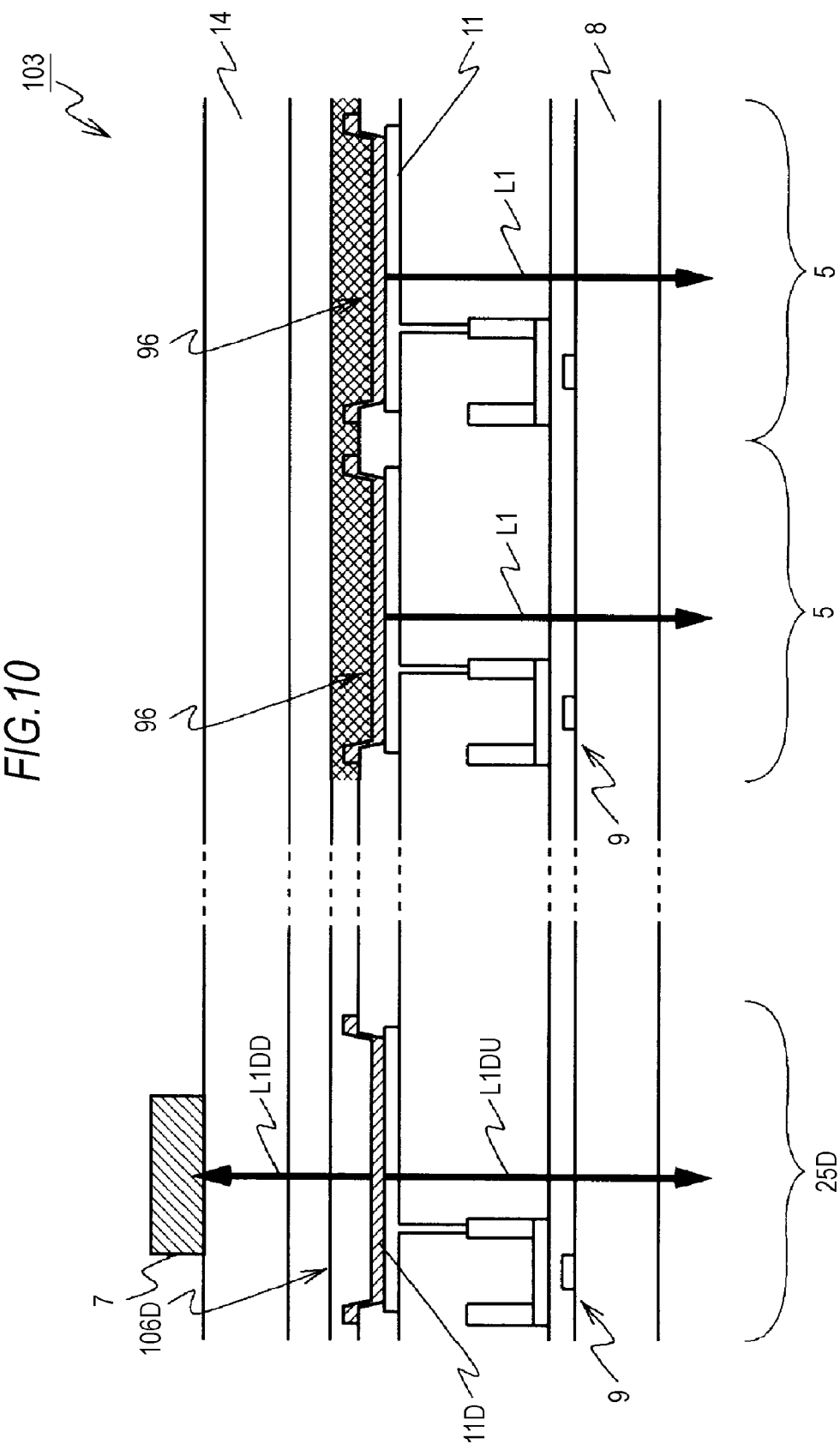

IMAGE DISPLAY PANEL, IMAGE DISPLAY DEVICE, AND MANUFACTURING METHOD OF THE IMAGE DISPLAY PANEL

CROSS REFERENCES TO RELATED APPLICATIONS

The present application claims priority to Japanese Priority Patent Application JP 2008-318270 filed in the Japan Patent Office on Dec. 15, 2008, the entire contents of which is hereby incorporated by reference.

BACKGROUND

The present application relates to an image display panel, an image display device, and a manufacturing method for the image display panel and can be suitably applied to an active matrix image display device employing self-light emitting elements such as organic EL elements. In the present application, monitoring light is emitted from a self-light emitting element for monitoring used for luminance adjustment to an opposite side of a side to which a self-light emitting element for image display emits light, whereby restrictions on housing design are reduced compared with those in the past and deterioration in an image quality is prevented.

In recent years, the development of an active matrix image display device employing organic EL elements is actively performed. The organic EL elements are self-light emitting elements of a current driving type, light emission luminance L of which is represented by light emission efficiency Φ and a driving current I. In the active matrix image display device employing the organic EL elements, pixel circuits including the organic EL elements and driving circuits that drive the organic EL elements are arranged in a matrix shape to form an image display unit. A desired image is displayed on the image display unit.

However, light emission efficiency of the organic EL elements falls more as light emission luminance is higher or the organic EL elements are used for a longer time. As a result, when the image display device employing the organic EL elements displays a still image having large contrast for a long time, so-called burn-in and a change in chromaticity occurs. Further, luminance changes because of aged deterioration. Therefore, for example, JP-A-2007-156044 discloses an image display device that corrects a fall in light emission luminance and prevents burn-in, a change in chromaticity, and the like.

FIG. 11A is a diagram of an image display device disclosed in JP-A-2007-156044. This image display device 1 drives an image display panel 3 with image data D1 input via a luminance correcting unit 2 and displays a desired image. In the image display panel 3, pixel circuits 5 are arranged in a matrix shape to form an image display unit 4. The pixel circuits 5 include organic EL elements 6 that form pixels and driving circuits that drive the organic EL elements 6. The image display panel 3 drives the pixel circuits 5 according to the image data D1 with a signal line driving circuit and a scanning line driving circuit not shown in the figure and displays an image formed by the image data D1 on the image display unit 4.

As shown in FIG. 11B as a sectional view taken along A-A line in FIG. 11A, the image display panel 3 shown in FIG. 11A is an image display panel of a top emission type. Therefore, in the image display panel 3, as partially enlarged and shown in FIG. 12 in comparison with FIG. 11B, TFTs 9 and the like are formed on a lower insulating substrate 8 made of glass or the like to form driving circuits of the pixel circuits 5. Thereafter, after lower electrodes 11, organic EL layers 12, and upper electrodes 13 are sequentially formed and the organic EL elements 6 are formed, the entire organic EL elements 6 are sealed by an upper transparent substrate 14. In the organic EL elements 6, the lower electrodes 11 and the upper electrodes 13 are respectively formed by reflecting electrodes and transparent electrodes. The organic EL elements 6 emit emission light L1 to the upper transparent substrate 14 side.

In the image display panel 3, a pixel circuit 5D for monitoring and a light receiving element 7 are provided in a section other than the image display unit 4. Emission light L1D of an organic EL element 6D provided in the pixel circuit 5D is received by the light receiving element 7.

The luminance correcting unit 2 measures, on the basis of light emission luminance (indicated by luminance information in FIG. 11A) of the organic EL element 6D detected by the light receiving element 7, a change in light emission efficiency of the organic EL element 6D provided in the pixel circuit 5D for monitoring. The luminance correcting unit 2 predicts a change in light emission efficiency of the organic EL element 6D from a measurement result of the light emission efficiency according to comparison of driving of the organic EL elements 6 provided in the image display unit 4 and driving of the organic EL element 6D. The luminance correcting unit 2 corrects a gradation of the image data D1 on the basis of a result of the prediction.

JP-A-2006-11388 proposes a method of correcting fluctuation in light emission luminance of an organic EL element due to a temperature change using similar dummy pixels.

SUMMARY

In the image display device disclosed in JP-A-2007-156044, marked restrictions are imposed on housing design for a display.

In the image display device 1, an opening having a shape corresponding to the image display unit 4 is formed in a housing. The image display panel 3 is arranged in a section where this opening is formed such that the image display unit 4 may be viewed and the periphery of the image display unit 4 may not be viewed. Therefore, with the configuration shown in FIGS. 11A and 11B, when the light receiving element 7 is arranged on an emission surface side of the image display panel 3, it is difficult to form the housing sufficiently thin. Consequently, a restriction is imposed on the housing design. It is necessary to form the light receiving element 7 to prevent external light from being made incident thereon and block emission light of the organic EL elements. Consequently, another restriction is imposed on the housing design.

It is likely that emission light L1D of the dummy pixel leaks out to the image display unit 4 to deteriorate an image quality.

Therefore, it is desirable to provide an image display panel, an image display device, and a manufacturing method for the image display panel that can reduce restrictions on housing design compared with those in the past and prevent deterioration in an image quality.

According to one embodiment, there is provided an image display panel including: a lower substrate; self-light emitting elements for image display that are arranged on the lower substrate in a matrix shape and form an image display unit; a self-light emitting element for monitoring that is arranged on the lower substrate and emits monitoring light for the image display unit; and an upper substrate that holds the self-light emitting elements for image display and the self-light emitting element for monitoring in conjunction with the lower substrate. The self-light emitting elements for image display emit emission light to the lower substrate side or the upper substrate side. The self-light emitting element for monitoring emits the monitoring light to at least the upper substrate side or the lower substrate side.

According to another embodiment, there is provided an image display panel including: a lower substrate; self-light emitting elements for image display that are arranged on the lower substrate in a matrix shape and form an image display unit; a self-light emitting element for monitoring that is arranged on the lower substrate and emits monitoring light for the image display unit; and an upper substrate that holds the self-light emitting elements for image display and the self-light emitting element for monitoring in conjunction with the lower substrate. The self-light emitting elements for image display emit emission light to the lower substrate side or the upper substrate side. The self-light emitting element for monitoring emits the monitoring light to the upper substrate side or the lower substrate side. A light emitting element that receives the monitoring light is provided.

According to a still another embodiment, there is provided an image display device including: an image display panel that displays image data; and a luminance correcting unit that corrects light emission luminance of the image display panel on the basis of a light reception result of the light receiving element provided in the image display panel. The image display panel includes: a lower substrate; self-light emitting elements for image display that are arranged on the lower substrate in a matrix shape and form an image display unit; a self-light emitting element for monitoring that is arranged on the lower substrate and emits monitoring light for the image display unit; and an upper substrate that holds the self-light emitting elements for image display and the self-light emitting element for monitoring in conjunction with the lower substrate. The self-light emitting elements for image display emit emission light to the lower substrate side or the upper substrate side. The self-light emitting element for monitoring emits the monitoring light to the upper substrate side or the lower substrate side. The light emitting element that receives the monitoring light is provided.

According to a yet another embodiment, there is provided a manufacturing method for an image display panel including: a lower substrate; self-light emitting elements for image display that are arranged on the lower substrate in a matrix shape and form an image display unit; a self-light emitting element for monitoring that is arranged on the lower substrate and emits monitoring light for the image display unit; and an upper substrate that holds the self-light emitting elements for image display and the self-light emitting element for monitoring in conjunction with the lower substrate, the self-light emitting elements for image display being organic EL elements of a top emission type and the self-light emitting element for monitoring being an organic EL element of a bottom emission type, the manufacturing method including the steps of: forming lower electrodes of the self-light emitting elements for image display and the self-light emitting element for monitoring on the lower substrate; forming organic EL layers of the self-light emitting elements for image display and the self-light emitting element for monitoring on the lower electrode; and forming upper electrodes of the self-light emitting elements for image display and the self-light emitting element for monitoring on the organic EL layers. The step of forming lower electrodes includes the steps of: forming reflective electrodes of the self-light emitting elements for image display on the lower substrate; and forming a transparent electrode of the self-light emitting element for monitoring on the lower substrate.

According to a further another embodiment, there is provided a manufacturing method for an image display panel including: a lower substrate; self-light emitting elements for image display that are arranged on the lower substrate in a matrix shape and form an image display unit; a self-light emitting element for monitoring that is arranged on the lower substrate and emits monitoring light for the image display unit; and an upper substrate that holds the self-light emitting elements for image display and the self-light emitting element for monitoring in conjunction with the lower substrate, the self-light emitting elements for image display being organic EL elements of a top emission type and the self-light emitting element for monitoring being an organic EL element of a bottom emission type, the manufacturing method including the steps of: forming lower electrodes of the self-light emitting elements for image display and the self-light emitting element for monitoring on the lower substrate; forming organic EL layers of the self-light emitting elements for image display and the self-light emitting element for monitoring on the lower electrode; and forming upper electrodes of the self-light emitting elements for image display and the self-light emitting element for monitoring on the organic EL layers. The step of forming upper electrodes includes the steps of: forming transparent electrodes on the organic EL layers of the self-light emitting elements for image display and the self-light emitting element for monitoring; and forming a reflective electrode of the transparent electrode of the self-light emitting element for monitoring.

According to a still further embodiment, there is provided a manufacturing method for an image display panel including: a lower substrate; self-light emitting elements for image display that are arranged on the lower substrate in a matrix shape and form an image display unit; a self-light emitting element for monitoring that is arranged on the lower substrate and emits monitoring light for the image display unit; and an upper substrate that holds the self-light emitting elements for image display and the self-light emitting element for monitoring in conjunction with the lower substrate, the self-light emitting elements for image display being organic EL elements of a top emission type and the self-light emitting element for monitoring being an organic EL element of a bottom emission type, the manufacturing method including the steps of: forming lower electrodes of the self-light emitting elements for image display and the self-light emitting element for monitoring on the lower substrate; forming organic EL layers of the self-light emitting elements for image display and the self-light emitting element for monitoring on the lower electrode; and forming upper electrodes of the self-light emitting elements for image display and the self-light emitting element for monitoring on the organic EL layers. In the step of forming organic EL layers, all or a part of plural organic layers forming the organic EL layers are formed by the self-light emitting elements for image display and the self-light emitting element for monitoring in the same process.

According to a yet further another embodiment, there is provided a manufacturing method for an image display panel including: a lower substrate; self-light emitting elements for image display that are arranged on the lower substrate in a matrix shape and form an image display unit; a self-light emitting element for monitoring that is arranged on the lower substrate and emits monitoring light for the image display unit; and an upper substrate that holds the self-light emitting elements for image display and the self-light emitting element for monitoring in conjunction with the lower substrate, the self-light emitting elements for image display being organic EL elements of a bottom emission type and the self-light emitting element for monitoring being an organic EL element of a top emission type, the manufacturing method including the steps of: forming lower electrodes of the self-light emitting elements for image display and the self-light emitting element for monitoring on the lower substrate; forming organic EL layers of the self-light emitting elements for image display and the self-light emitting element for monitoring on the lower electrode; and forming upper electrodes of the self-light emitting elements for image display and the self-light emitting element for monitoring on the organic EL layers. The step of forming lower electrodes includes the steps of: forming a reflective electrode of the self-light emitting element for monitoring on the lower substrate; and forming a transparent electrode on the reflective electrode of the self-light emitting element for monitoring and forming transparent electrodes of the self-light emitting elements for image display on the lower substrate.

According to a further embodiment, there is provided a manufacturing method for an image display panel including: a lower substrate; self-light emitting elements for image display that are arranged on the lower substrate in a matrix shape and form an image display unit; a self-light emitting element for monitoring that is arranged on the lower substrate and emits monitoring light for the image display unit; and an upper substrate that holds the self-light emitting elements for image display and the self-light emitting element for monitoring in conjunction with the lower substrate, the self-light emitting elements for image display being organic EL elements of a bottom emission type and the self-light emitting element for monitoring being an organic EL element of a top emission type, the manufacturing method including the steps of: forming lower electrodes of the self-light emitting elements for image display and the self-light emitting element for monitoring on the lower substrate; forming organic EL layers of the self-light emitting elements for image display and the self-light emitting element for monitoring on the lower electrode; and forming upper electrodes of the self-light emitting elements for image display and the self-light emitting element for monitoring on the organic EL layers. The step of forming upper electrodes includes the steps of: forming transparent electrodes on the organic EL layers of the self-light emitting elements for image display and the self-light emitting element for monitoring; and forming reflective electrodes on the transparent electrodes of the self-light emitting elements for image display.

According to a still further embodiment, there is provided a manufacturing method for an image display panel including: a lower substrate; self-light emitting elements for image display that are arranged on the lower substrate in a matrix shape and form an image display unit; a self-light emitting element for monitoring that is arranged on the lower substrate and emits monitoring light for the image display unit; and an upper substrate that holds the self-light emitting elements for image display and the self-light emitting element for monitoring in conjunction with the lower substrate, the self-light emitting elements for image display being organic EL elements of a bottom emission type and the self-light emitting element for monitoring being an organic EL element of a top emission type, the manufacturing method including the steps of: forming lower electrodes of the self-light emitting elements for image display and the self-light emitting element for monitoring on the lower substrate; forming organic EL layers of the self-light emitting elements for image display and the self-light emitting element for monitoring on the lower electrode; and forming upper electrodes of the self-light emitting elements for image display and the self-light emitting element for monitoring on the organic EL layers. In the step of forming organic EL layers, all or a part of plural organic layers forming the organic EL layers are formed by the self-light emitting elements for image display and the self-light emitting element for monitoring in the same process.

With the configurations according to some embodiments, if the self-light emitting elements for image display emit the emission light to the lower substrate side or the upper substrate side and the self-light emitting element for monitoring emits the monitoring light to the upper substrate side or the lower substrate side, the light receiving element that receives the monitoring light can be arranged on the opposite side of an emission surface of the image display panel. Therefore, it is possible to reduce restrictions on housing design. Further, it is possible to reduce leakage of the monitoring light into the image display unit and reduce deterioration in an image quality.

With the configuration according to the fourth, fifth, sixth, seventh, eighth, or ninth embodiment, it is possible to reduce restrictions on housing design and reduce deterioration in an image quality by arranging, on the opposite side of an emission surface of the image display panel, the light emitting elements that receives the monitoring light. In both the organic EL elements for image display and the organic EL element for monitoring, organic EL element layers can be held by the transparent electrodes. In both the organic EL elements for image display and the organic EL element for monitoring, the organic EL element layers and the transparent electrodes can be simultaneously formed in the same process. Therefore, it is possible to reduce irregularity of characteristics between the organic EL elements for image display and the organic EL element for monitoring and improve accuracy of luminance correction.

According to the embodiments, it is possible to reduce restrictions on housing design compared with those in the past and prevent deterioration in an image quality.

Additional features and advantages are described herein, and will be apparent from the following Detailed Description and the figures.

BRIEF DESCRIPTION OF THE FIGURES

FIG. 10 is a sectional view of an image display panel applied to an image display device according to an embodiment;

DETAILED DESCRIPTION

Embodiments of the present application are explained in detail below with reference to the accompanying drawings as appropriate. The embodiments are explained in order described below.

1. First Embodiment
2. Second Embodiment
3. Third Embodiment
4. Fourth Embodiment
5. Fifth Embodiment
6. Sixth Embodiment
7. Seventh Embodiment
8. Eighth Embodiment
9. Ninth Embodiment
10. Modifications

First Embodiment

Configuration of the Embodiment

Figure 1:
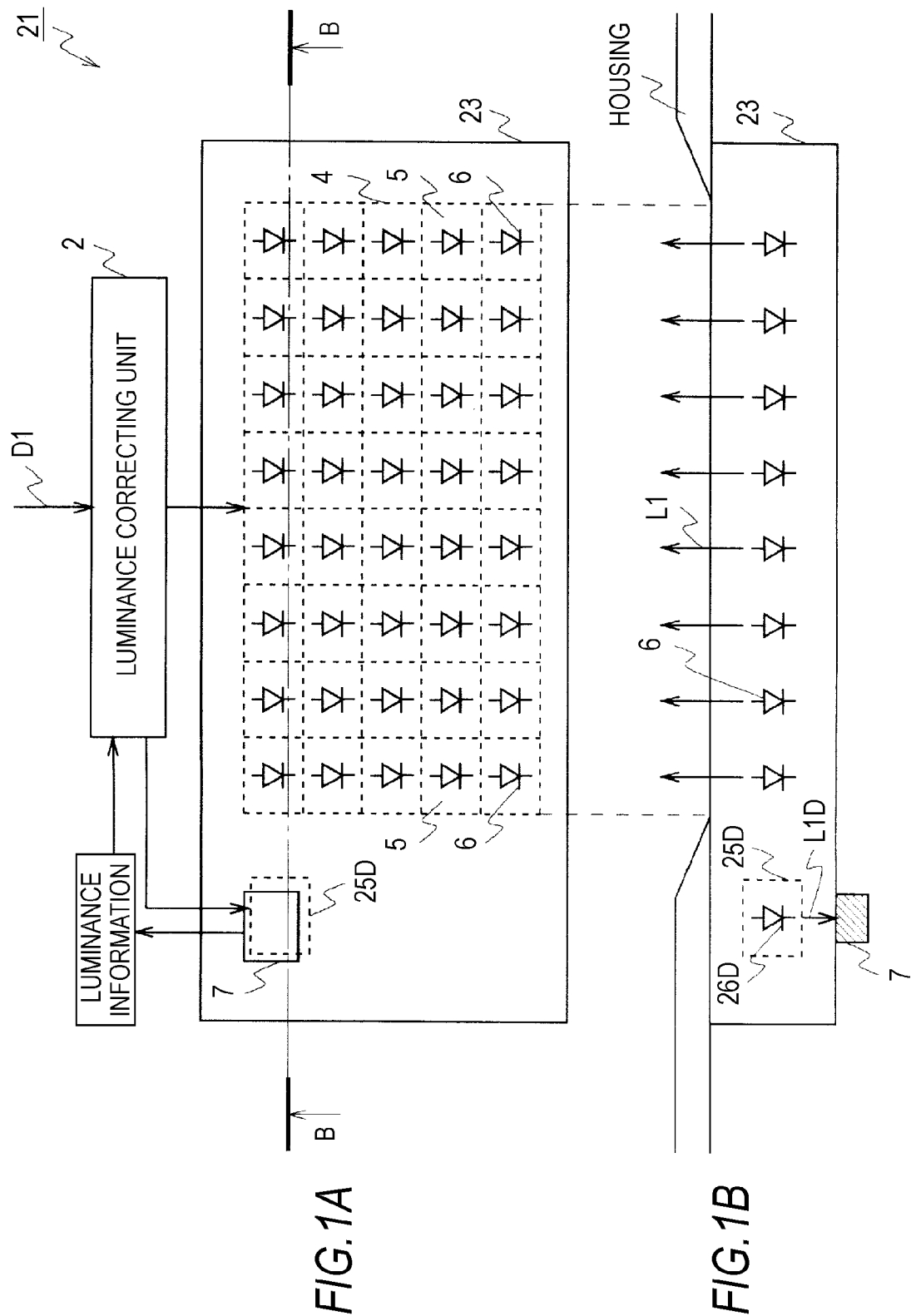
FIGS. 1A and 1B are diagrams of an image display device according to an embodiment.
Figures 11A, 11B:
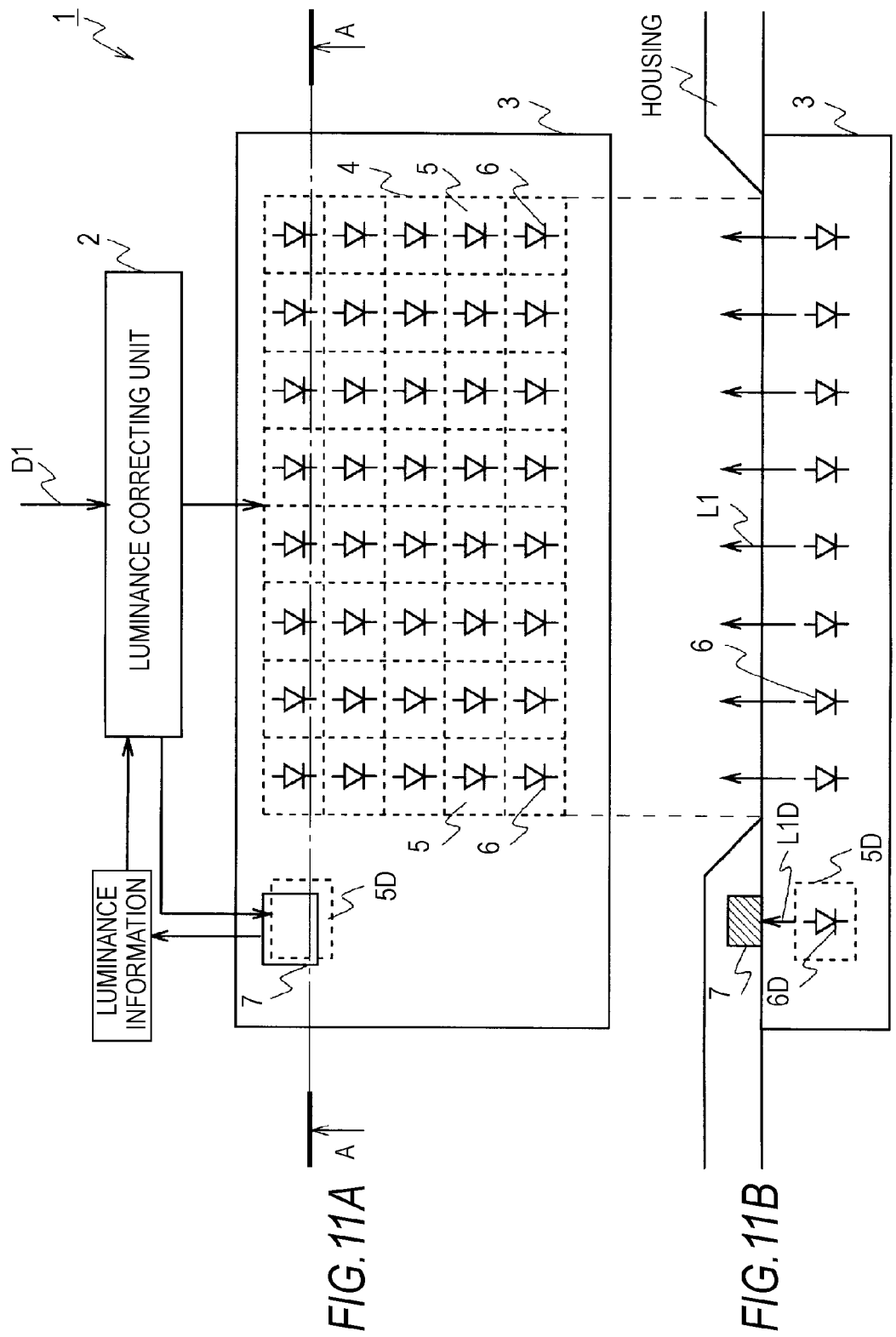
FIGS. 11A and 11B are diagrams of an image display device in the past.

FIGS. 1A and 1B are diagrams of an image display device according to an embodiment shown in comparison with FIGS. 11A and 11B. In this image display device 21, components same as those of the image display device 1 explained with reference to FIGS. 11A and 11B are denoted by the same reference numerals and signs and redundant explanation of the components is omitted.

The image display device 21 drives an image display panel 23 with image data D1 input via a luminance correcting unit 2 and displays a desired image. In the image display panel 23, an image display unit 4 is formed by arranging pixel circuits 5 in a matrix shape. Organic EL elements 6 for image display provided in the image display unit 4 are formed as organic EL elements of a top emission type. The image display panel 23 includes a pixel circuit 25D for monitoring. An organic EL element 26D provided in the pixel circuit 25D for monitoring is formed as an organic EL element of a bottom emission type. Therefore, the pixel circuit 25D for monitoring emits emission light L1D of the organic EL element 26D to a rear surface side. Emission light of the organic EL element 26D provided in the pixel circuit 25D for monitoring is hereinafter referred to as monitoring light as appropriate. The pixel circuit 25D for monitoring is formed in size and a shape same as those of the pixel circuits 5 of the image display unit 4.

In the image display device 21, a light receiving element 7 that receives the monitoring light L1D is arranged on a rear surface side of the image display panel 23. The light receiving element 7 is, for example, a photodiode and is arranged to be bonded to the image display panel 23 by, for example, a transparent adhesive. The image display device 21 drives the organic EL element 26D under a fixed condition with the luminance correcting unit 2 and detects a change in light emission efficiency of the organic EL element 26D at a fixed time interval according to a light reception result of the light receiving element 7. The image display device 21 corrects the gradation of the image data D1 with the luminance correcting unit 2 on the basis of the detected change in the light emission efficiency and outputs the image data D1 to the image display panel 23 to thereby correct a fall in light emission luminance and prevent burn-in. The luminance correcting unit 2 may drive the organic EL element 26D with predetermined fixed driving voltage or driving current according to necessity or driving voltage or driving current corresponding to the image data D1. The time interval for detecting the light emission efficiency of the organic EL element 26D can be variously set according to necessity.

Figure 2:
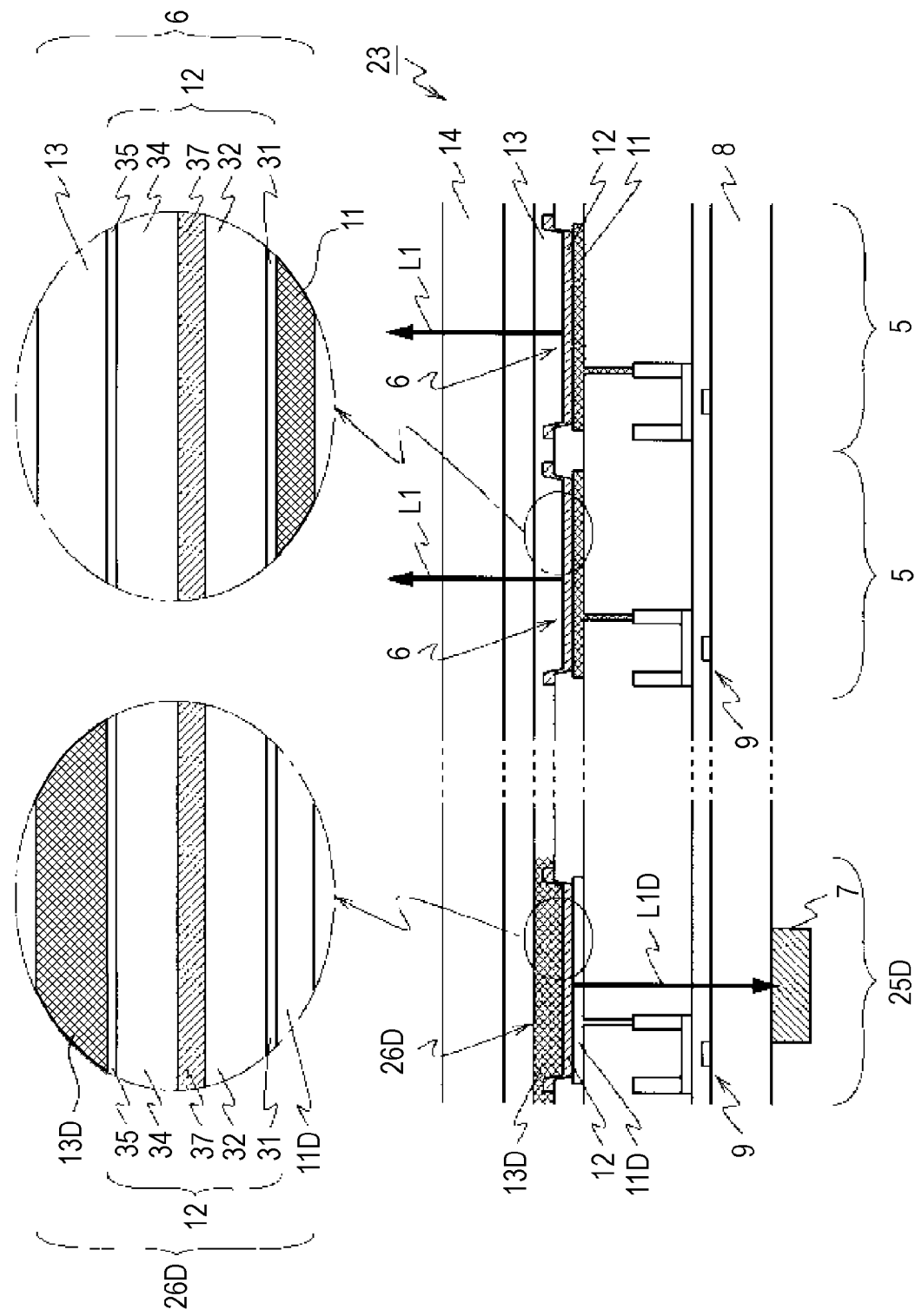
FIG. 2 is a sectional view of an image display panel of the image display device shown in FIGS. 1A and 1B.

FIG. 2 is a sectional view served for explanation of a manufacturing process for the image display panel 23. In the image display pane 23, TFTs 9 and the like are formed on a lower insulating substrate 8 made of glass or the like and driving circuits for the pixel circuits 5 and 25D are formed. Thereafter, after the organic EL elements 6 and 26D are formed, the entire organic EL elements 6 and 26D are sealed by an upper transparent substrate 14.

In the organic EL elements 6 and 26D, after lower electrodes 11 of the organic EL elements 6 for image display are formed by reflective electrodes, a lower electrode 11D of the organic EL element 26D for monitoring is formed by a transparent electrode. The order of the process for forming the lower electrodes 11 of the organic EL elements 6 for image display and the process for forming the lower electrode 11D of the organic EL element 26D for monitoring may be reversed.

Subsequently, in the organic EL elements 6 and 26D, organic EL layers 12 are simultaneously formed in the same process. The organic EL layers 12 are formed by laminating hole injection layers 31, hole transport layers 32, light emitting layers 37, electron transport layers 34, and electron injection layers 35.

In the organic EL elements 6 and 26D, after upper electrodes 13 of the organic EL elements 6 for image display are formed by transparent electrodes, an upper electrode 13D of the organic EL element 26D for monitoring is formed by a reflective electrode. The order of the process for forming the upper electrodes 13 of the organic EL elements 6 for image display and the process for forming the upper electrode 13D of the organic EL element 26D for monitoring may be reversed.

Operation According to the Embodiment

In the image display device 21 having the configuration explained above (FIGS. 1A and 1B), the image data D1 as a display target is input to the image display panel 23 via the luminance correcting unit 2. The image display unit 4 is driven according to the image data D1. In the image display unit 4, the organic EL elements 6 are driven by the pixel circuits 5 according to the driving with the image data D1, whereby an image of the image data D1 is displayed on the image display unit 4.

However, the organic EL elements 6 have a drawback in that light emission efficiency changes because of long-time use and the like. As a result, in the image display device 21, it is likely that so-called burn-in and a change in chromaticity occur. Further, luminance changes because of aged deterioration. Therefore, in the image display device 21, the organic EL element 26D for monitoring is provided separately from the organic EL elements 6 for image display to monitor the organic EL elements 6 provided in the image display unit 4. The emission line L1D of the organic EL element 26D for monitoring is received by the light receiving element 7. Light emission efficiency in the organic EL element 26D for monitoring is detected by the luminance correcting unit 2 according to a light reception result of the light receiving element 7. In the image display device 21, the gradation of the image data D1 output to the image display panel 23 is corrected on the basis of the light emission efficiency in the organic EL element 26D for monitoring. A change in light emission luminance due to a change in the light emission efficiency in the image display unit 4 is suppressed. As a result, in the image display device 21, luminance change due to the so-called burn-in, the change in chromaticity, and the aged deterioration can be prevented.

The organic EL elements 6 and the TFTs and the like forming the driving circuits for the organic EL elements 6 have a drawback in that characteristic fluctuation due to temperature is large. In the image display device 21, it is likely that luminance and chromaticity change because of this characteristic fluctuation. However, as in this embodiment, when the configuration including the organic EL element 26D for monitoring, the light receiving element 7, and the luminance correcting unit 2 is provided, the change in luminance and chromaticity due to temperature can be prevented.

Figure 12:
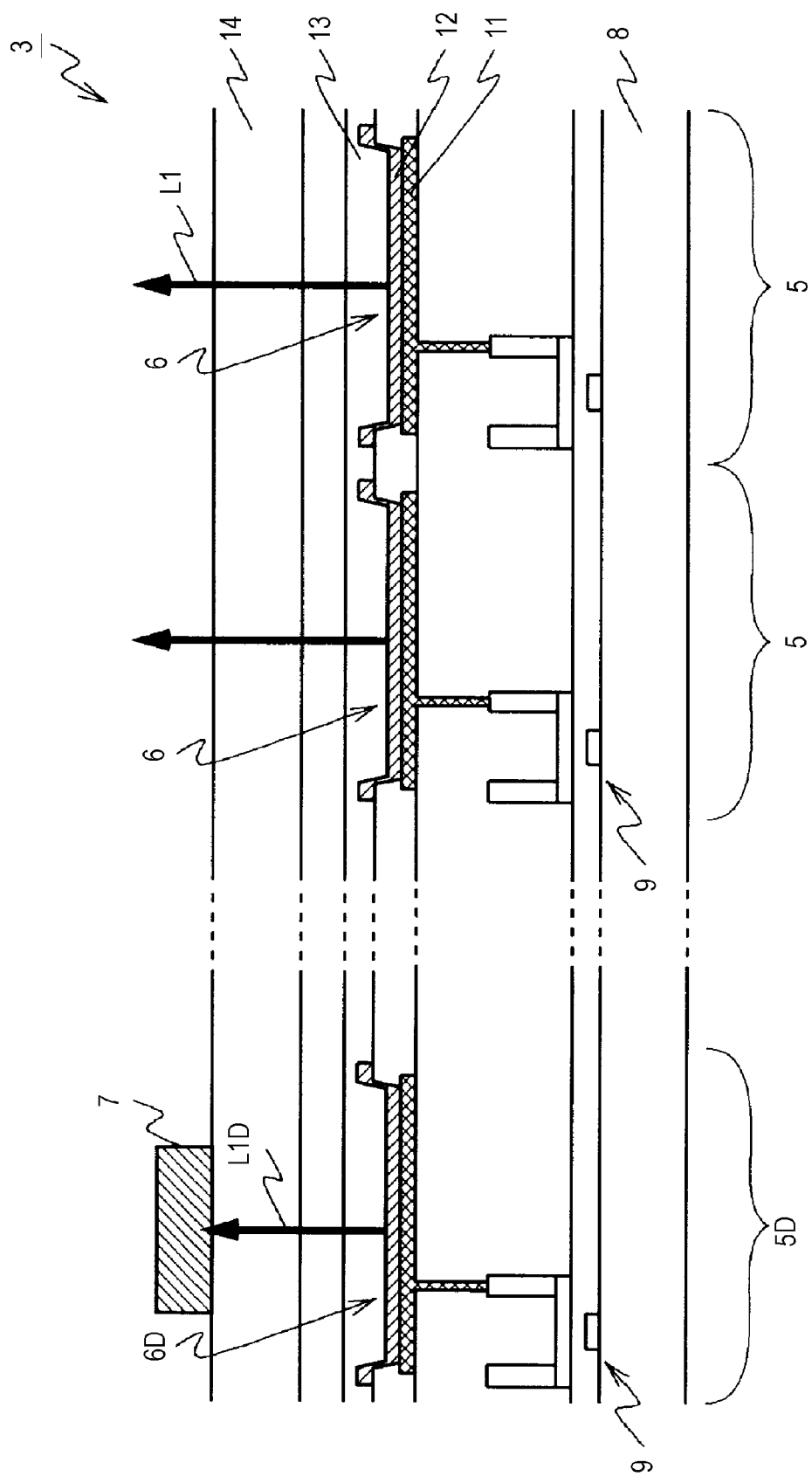
FIG. 12 is a sectional view of an image display panel applied to the image display device shown in FIGS. 11A and 11B.

However, if the organic EL elements 6 for image display and the organic EL element 26D for monitoring are simply formed the same, emitting directions of emission light are the same in the organic EL elements 6 for image display and the organic EL element 26D for monitoring. As a result, the light receiving element 7 that receives the emission light of the organic EL element 26D for monitoring needs to be arranged on an emission surface side of the image display panel (see FIGS. 11A and 11B and 12). In this case, the light receiving element 7 makes it difficult to reduce the thickness of a housing or it is necessary to prevent external light from being made incident on the light receiving element 7. As a result, marked restrictions are imposed on housing design. It is also likely that the light L1D from the organic EL element 26D for monitoring leaks out to the image display unit 4 and an image quality is deteriorated.

Therefore, in the image display device 21, the organic EL element 26D for monitoring is formed to emit emission light to the opposite side of a side on which the organic EL elements 6 for image display emit light. More specifically, the organic EL elements 6 for image display are formed as organic EL elements of the top emission type and the organic EL element 26D for monitoring is formed as an organic EL element of the bottom emission type. Therefore, the light receiving element 7 that receives the emission light L1D of the organic EL element 26D for monitoring can be arranged on a rear surface on the opposite side of the emission surface. The emission surface of the image display panel 23 can be formed as a flat surface. As a result, it is possible to effectively prevent marked restrictions on housing design due to the arrangement of the light emitting element on the emission surface and simplify the housing design compared with that in the past. Since it is unnecessary to block emission light emitted from the organic EL element 26D for monitoring on the emission surface side, it is possible to simplify the housing design compared with that in the past. Further, since the emission light L1D is emitted from the organic EL element 26D for monitoring to the opposite side of the emission surface, it is possible to reduce light leaking out to the image display unit 4 compared with that in the past. As a result, image quality deterioration can be reduced.

Therefore, in the image display device 21 (FIG. 2), the lower electrodes 11 and the upper electrodes 13 of the organic EL elements 6 for image display are respectively formed by reflective electrodes and transparent electrodes and the lower electrode 11D and the upper electrode 13D of the organic EL element 26D for monitoring are respectively formed by a transparent electrode and a reflective electrode. In the image display device 21, after the lower electrodes 11 of the organic EL elements 6 for image display and the lower electrode 11D of the organic EL element 26D for monitoring are formed, the organic EL layers 12 of the organic EL elements 6 for image display and the organic EL layer 12 of the organic EL element 26D for monitoring are formed. The organic EL layer 12 of the organic EL elements 6 for image display and the organic EL layer 12 of the organic EL element 26D for monitoring are preferably simultaneously formed in the same process. In general, an organic EL layer includes plural organic layers. However, at least one or more of the organic layers are preferably simultaneously formed in the same process. Thereafter, in the image display device 21, the upper electrodes 13 of the organic EL elements 6 for image display and the upper electrode 13D of the organic EL element 26D for monitoring are formed.

As a result, in the image display device 21, even when the organic EL elements 6 and 26D for image display and for monitoring are respectively formed as organic EL elements of the top emission type and the bottom emission type, it is possible to reduce irregularity in characteristics between the organic EL elements 6 and 26D as much as possible. As a result, it is possible to sufficiently secure accuracy of luminance correction by the luminance correcting unit 2.

Effects of the Embodiment

With the configuration explained above, monitoring light from the self-light emitting element for monitoring is emitted on the opposite side of a side on which the self-light emitting elements for image display emit light. This makes it possible to reduce restrictions on housing design compared with those in the past and prevent deterioration in an image quality.

Specifically, the self-light emitting elements for image display are formed as organic EL elements of the top emission type and the self-light emitting element for monitoring is formed as an organic EL element of the bottom emission type. This makes it possible to reduce restrictions on housing design compared with those in the past and prevent deterioration in an image quality.

Second Embodiment

Figure 3:
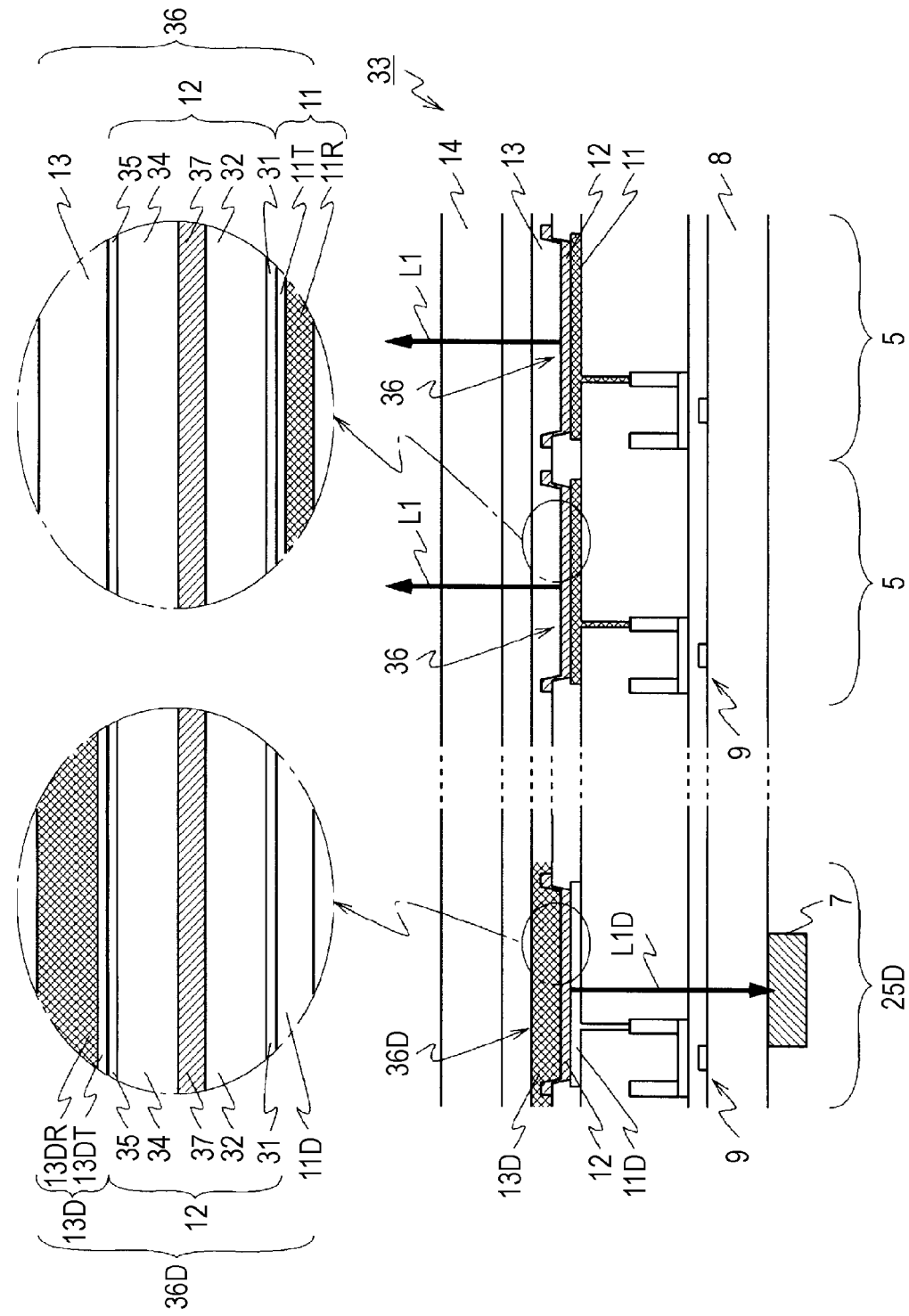
FIG. 3 is a sectional view of an image display panel applied to an image display device according to an embodiment.

FIG. 3 is a sectional view of an image display panel applied to an image display device according to an embodiment. The image display device according to this embodiment is configured the same as the image display device according to the first embodiment except that the image display panel shown in FIG. 3 is applied instead of the image display panel 23.

The image display panel 33 is configured the same as the image display panel 23 according to the first embodiment except that organic EL elements 36 and 36D for image display and for monitoring are arranged instead of the organic EL elements 6 and 26D for image display and for monitoring. The organic EL elements 36 and 36D are formed the same as the organic EL elements 6 and 26D except that configurations of the lower electrodes 11 and the upper electrode 13D are respectively different from those of the organic EL elements 6 and 26D.

In the image display panel 33, the TFTs 9 and the like are formed on the lower insulating substrate 8 made of glass or the like and driving circuits for the pixel circuits 5 and 25D are formed. Thereafter, after the organic EL elements 36 and 36D are formed, the entire organic EL elements 36 and 36D are sealed by the upper transparent substrate 14.

In the organic EL elements 36 and 36D, reflective electrodes 11R are formed in sections corresponding to the lower electrodes 11 of the organic EL elements 36 for image display. Subsequently, in the organic EL elements 36 and 36D, transparent electrodes 11T and 11D are simultaneously formed on the reflective electrodes 11R and in a section corresponding to the lower electrode 11 of the organic EL element 36D for monitoring. The organic EL layers 12 are simultaneously arranged in the same process.

Consequently, in the organic EL elements 36 and 36D, the lower electrodes 11 and 11D are formed with the transparent electrodes 11T and 11D arranged on the side of interfaces with the organic EL layers 12. More specifically, in the organic EL elements 36 for image display, the lower electrodes 11 are formed by reflective electrode structure including lamination of the reflective electrodes 11R and the transparent electrodes 11T. In the organic EL element 36D for monitoring, the lower electrode 11D is formed by the transparent electrode 11D.

Subsequently, in the organic EL elements 36 and 36D, transparent electrodes 13 and 13DT are formed in sections corresponding to the upper electrodes 13 and 13D of the organic EL elements 36 for image display and the organic EL element 36D for monitoring. A reflective electrode 13DR is formed on the transparent electrode 13DT of the organic EL element 36D for monitoring.

Consequently, in the organic EL elements 36 and 36D, the upper electrodes 13 and 13D are formed with the transparent electrodes 11T and 11D arranged on the sides of the interfaces with the organic EL elements 12. More specifically, in the organic EL elements 36 for image display, the upper electrodes 13 are formed by transparent electrodes. In the organic EL element 36D for monitoring, the upper electrode 13D is formed by reflective electrode structure including lamination of the transparent electrode 13DT and the reflective electrode 13DR.

With the configuration shown in FIG. 3, the transparent electrodes are arranged on the interfaces with the organic EL layers to form the reflective electrodes of the organic EL elements for image display and the reflective electrode of the organic EL element for monitoring. This makes it possible to further reduce irregularity in characteristics between the organic EL elements 36 and 36D and further improve accuracy of luminance correction by the luminance correcting unit 2.

Third Embodiment

Figure 4:
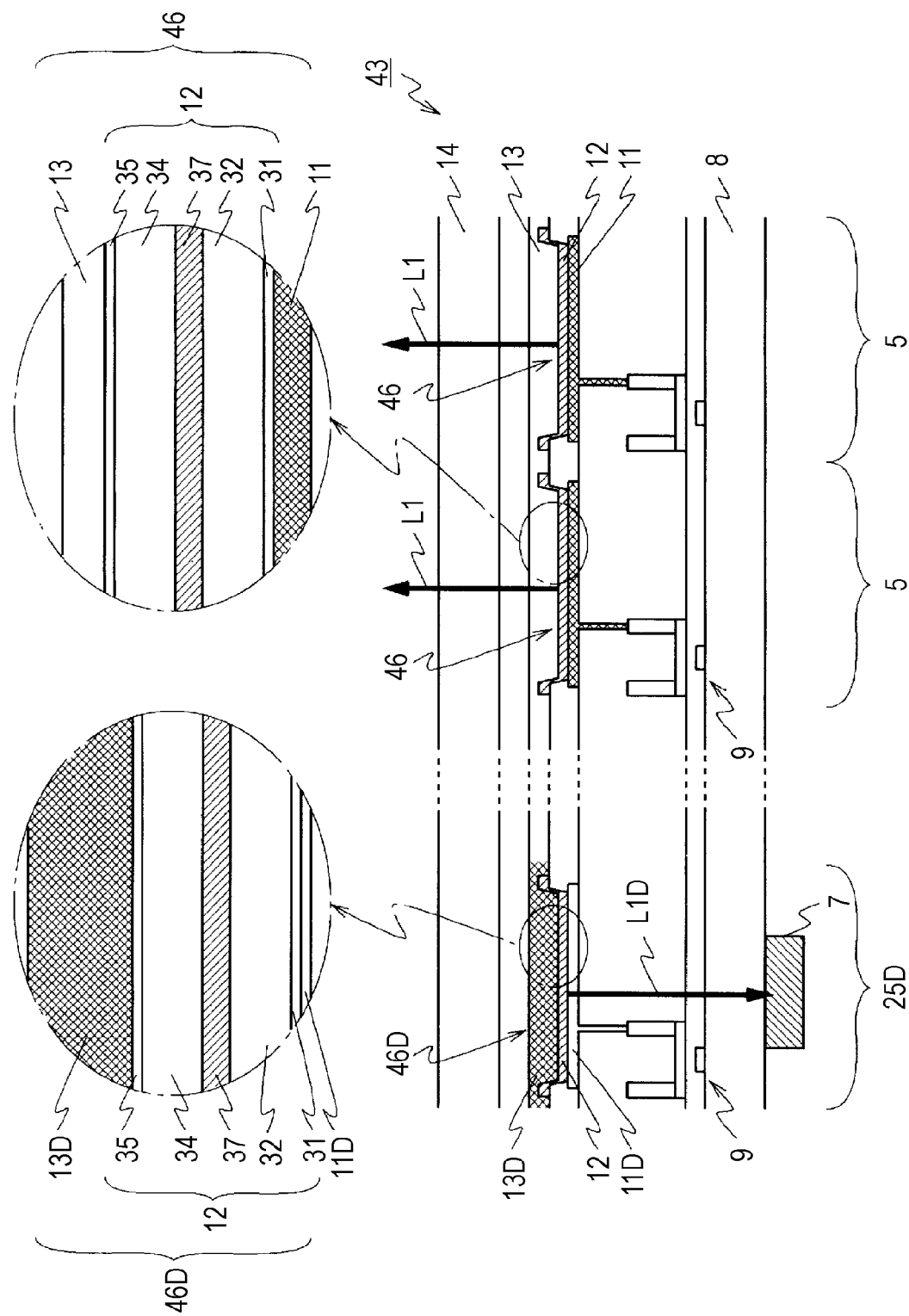
FIG. 4 is a sectional view of an image display panel applied to an image display device according to an embodiment.

FIG. 4 is a sectional view of an image display panel applied to an image display device according to an embodiment shown in comparison with FIGS. 2 and 3. The image display device according to this embodiment is configured the same as the image display devices according to the embodiments explained above except that an image display panel 43 shown in FIG. 4 is applied.

The image display panel 43 is configured the same as the image display panel 23 according to the first embodiment except that organic EL elements 46 and 46D for image display and for monitoring are arranged instead of the organic EL elements 6 and 26D for image display and for monitoring. The organic EL elements 46 and 46D are configured the same as the organic EL elements 6 and 26D except that configurations of the lower electrodes 11 and the upper electrode 13D are respectively different from those of the organic EL elements 6 and 26D.

In the image display panel 43, the TFTs 9 and the like are formed on the lower insulating substrate 8 made of glass or the like and driving circuits for the pixel circuits 5 and 25D are formed. Thereafter, after the organic EL elements 46 and 46D are formed, the entire organic EL elements 46 and 46D are sealed by the upper transparent substrate 14.

In the organic EL elements 46 and 46D, after the lower electrodes 11 and 11D are respectively formed by reflective electrodes and a transparent electrode of the same material having different thicknesses, the organic EL layers 12 are simultaneously formed in the same process. Subsequently, the upper electrodes 13 and 13D are respectively formed by transparent electrodes and a reflective electrode of the same material having different thicknesses.

The lower electrodes 11 and 11D and the upper electrodes 13 and 13D are formed with the same material and different thicknesses by replacing masks and executing sputtering twice. The lower electrodes 11 and 11B and the upper electrodes 13 and 13D are formed with thickness equal to or smaller than fixed thickness as transparent electrodes and formed with thickness equal to or larger than the fixed thickness as reflective electrodes.

In this embodiment, the reflective electrodes and the transparent electrodes are formed by using the same material and changing thickness. This makes it possible to use the same interface material of organic EL layers in the organic EL elements for image display and the organic EL element for monitoring. Consequently, it is possible to further reduce irregularity in characteristics of the organic EL elements 46 and 46D and further improve accuracy of luminance correction by the luminance correcting unit 2.

Fourth Embodiment

Figure 5:
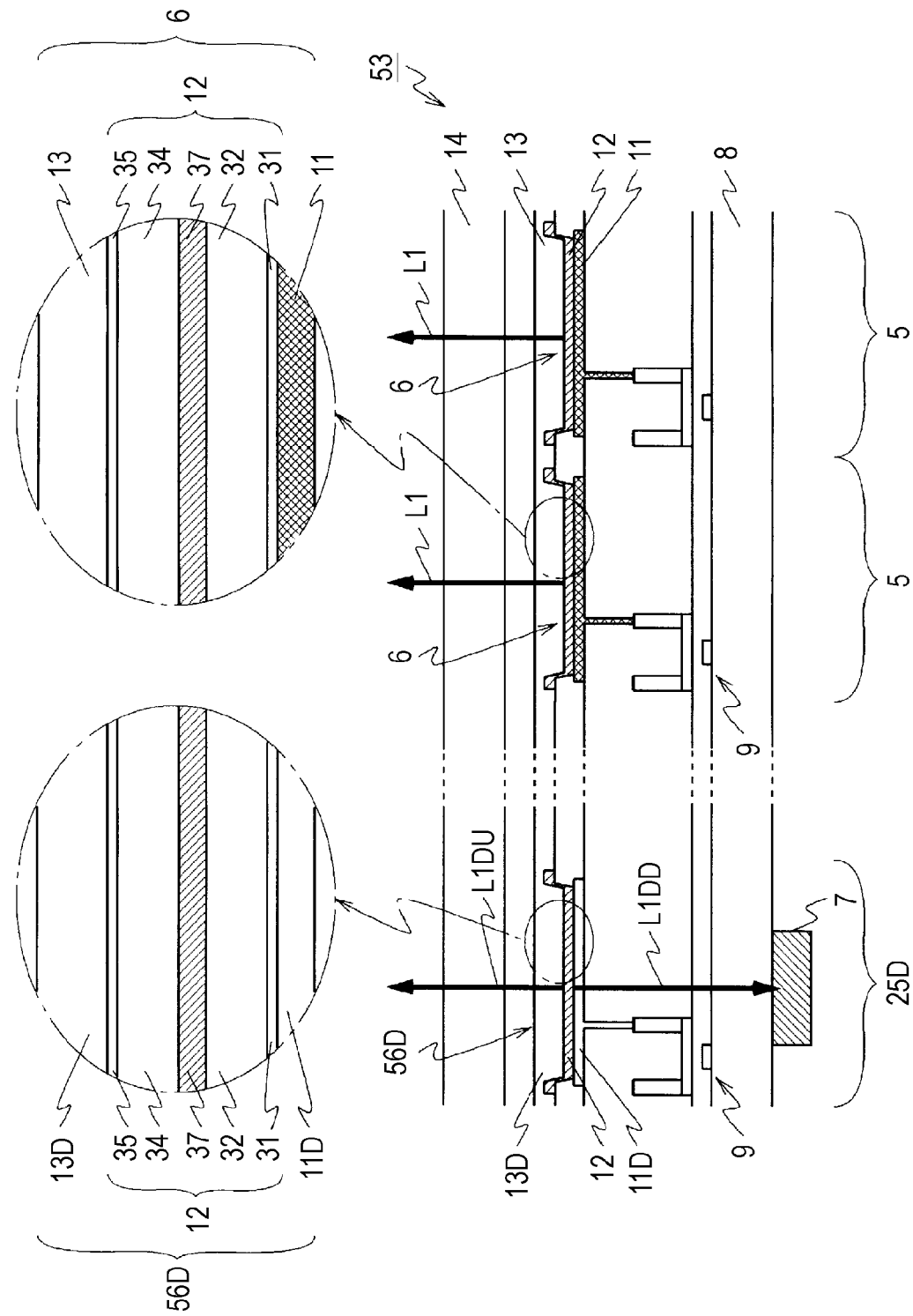
FIG. 5 is a sectional view of an image display panel applied to an image display device according to an embodiment.

FIG. 5 is a sectional view of an image display panel applied to an image display device according to an embodiment shown in comparison with FIG. 2. The image display device according to this embodiment is configured the same as the image display device according to the first embodiment except that an image display panel 53 shown in FIG. 5 is applied.

The image display panel 53 is configured the same as the image display panel 23 according to the first embodiment except that an organic EL element 56D for monitoring is arranged instead of the organic EL element 26D for monitoring. The organic EL element 56D for monitoring is configured the same as the organic EL element 26D except that the upper electrode 13D is formed in the same process and in the same manner as the upper electrodes 13 of the organic EL elements 6 for image display.

Therefore, in the image display panel 53, the organic EL element 56D for monitoring emits emission light to an emission surface and a rear surface of the emission surface as indicated by reference signs L1DU and L1DD and the light receiving element 7 receives the monitoring light L1DD emitted to the rear surface side.

According to this embodiment, even if the monitoring light is emitted to the emission surface side, effects same as those in the first embodiment can be obtained. In this embodiment, it is possible to commonly form the organic EL layers and the upper electrodes in the organic EL element for monitoring and the organic EL elements for image display. It is possible to reduce, with a simple configuration, irregularity in characteristics between the organic EL elements 6 and 56D and further improve accuracy of luminance correction by the luminance correcting unit 2.

Fifth Embodiment

Figure 6:
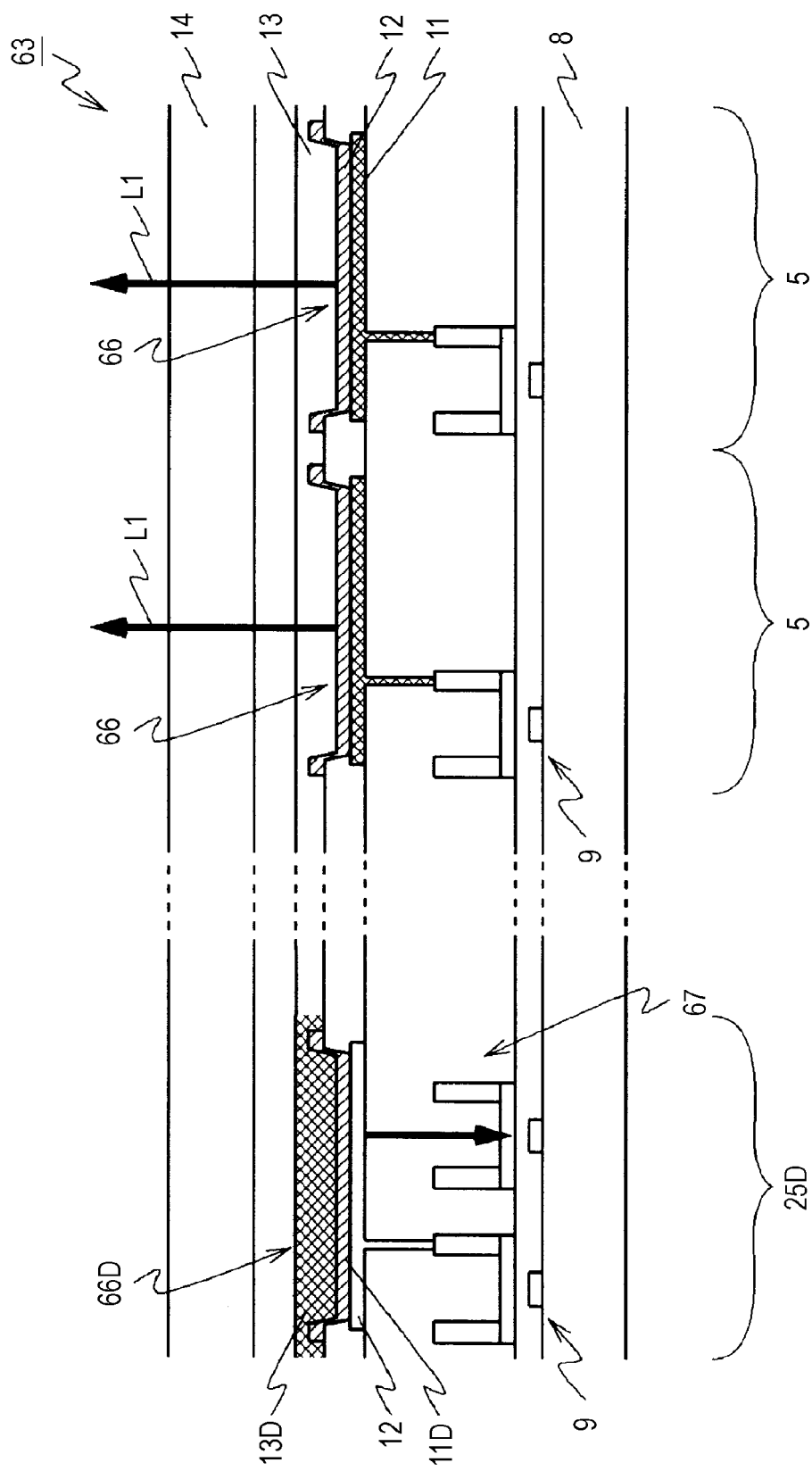
FIG. 6 is a sectional view of an image display panel applied to an image display device according to an embodiment.

FIG. 6 is a sectional view of an image display panel applied to an image display device according to an embodiment shown in comparison with FIGS. 2 to 5. The image display device according to this embodiment is configured the same as the image display devices according to the embodiments explained above except that an image display panel 63 shown in FIG. 6 is applied.

In the image display panel 63, when driving circuit for the pixel circuits 5 and 25 are formed, a light receiving element 67 is formed on the lower insulating substrate 8. The image display panel 63 is configured the same as the image display panels according to the first to fourth embodiments except that a configuration concerning the light receiving element 67 is different.

According to this embodiment, when the driving circuits for the pixel circuits are formed, the light receiving element is formed on the lower substrate. This makes it possible to obtain, with a simpler manufacturing process, effects same as those in the first to fourth embodiments and further reduce thickness of the image display panel.

Sixth Embodiment

Figure 7:
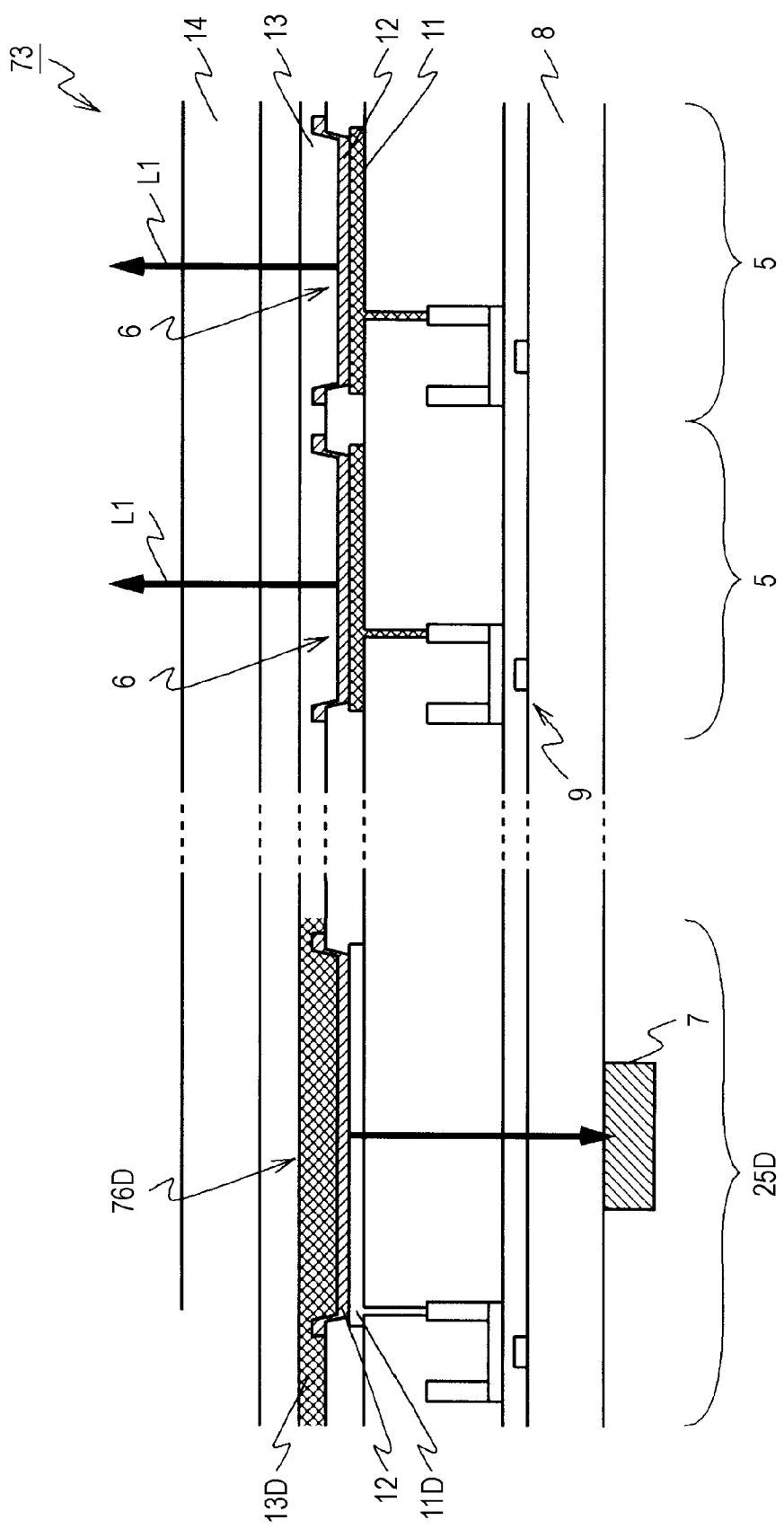
FIG. 7 is a sectional view of an image display panel applied to an image display device according to an embodiment.

FIG. 7 is a sectional view of an image display panel applied to an image display device according to an embodiment shown in comparison with FIGS. 2 to 6. The image display device according to this embodiment is configured the same as the image display devices according to the embodiments explained above except that an image display panel 73 shown in FIG. 7 is applied.

The image display panel 73 is configured the same as the image display panels of the image display device according to the embodiments explained above except that an aperture ratio of an organic EL element 76D for monitoring is increased by forming the organic EL element 76D for monitoring with a large area compared with the organic EL elements 6 for image display. The aperture ratio may be increased by, for example, changing a layout and a wiring pattern of a pixel circuit forming the organic EL element 76D for monitoring.

In this embodiment, the aperture ratio of the organic EL element for monitoring is increased compared with that of the organic EL elements for image display. This makes it possible to detect, at higher accuracy, a change in efficiency in the organic EL element for monitoring. Therefore, it is possible to further improve accuracy of luminance adjustment compared with the embodiments explained above.

Seventh Embodiment

Figure 8:
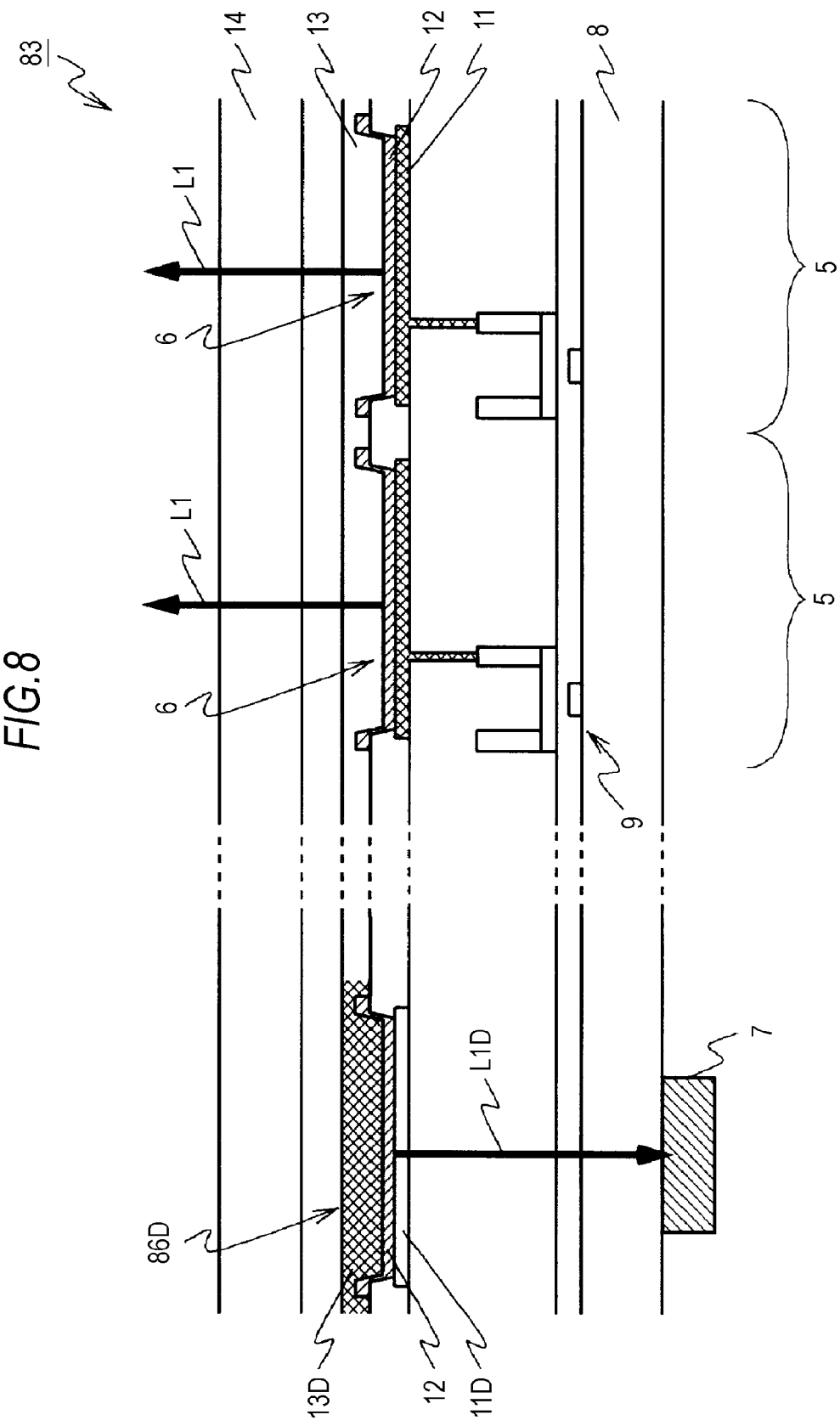
FIG. 8 is a sectional view of an image display panel applied to an image display device according to an embodiment.

FIG. 8 is a sectional view of an image display panel applied to an image display device according to an embodiment shown in comparison with FIGS. 2 to 7. The image display device according to this embodiment is configured the same as the image display devices according to the embodiments explained above except that an image display panel 83 shown in FIG. 8 is applied.

The image display panel 83 is configured the same as the image display panels of the image display devices according to the embodiments explained above except that an organic EL element 86D for monitoring is driven by a passive system.

In this embodiment, the organic EL element for monitoring is driven by the passive system. This makes it possible to obtain, with a simple configuration, effects same as those in the embodiments explained above.

Eighth Embodiment

Figure 9:
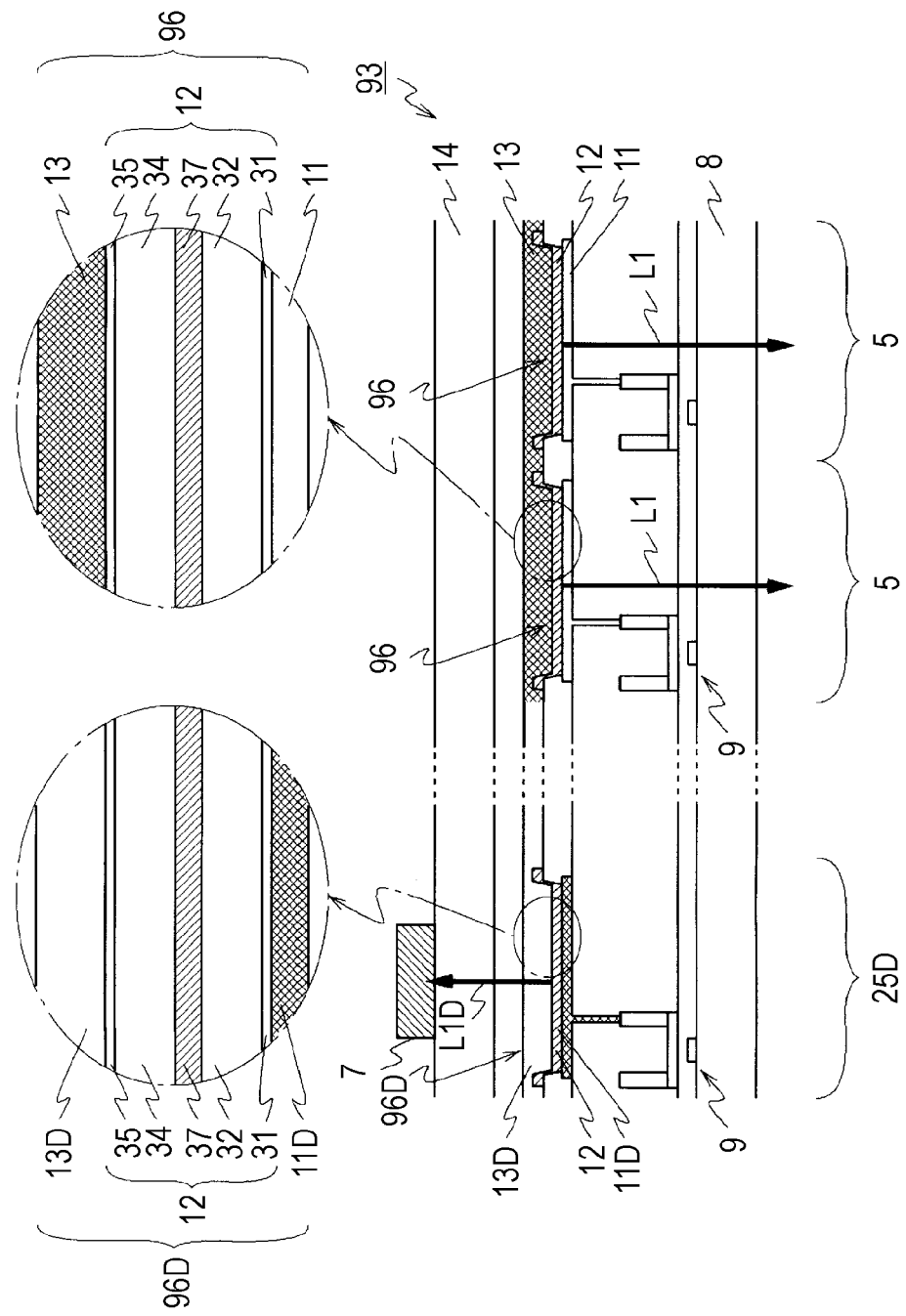
FIG. 9 is a sectional view of an image display panel applied to an image display device according to an embodiment to the present application.

FIG. 9 is a sectional view of an image display panel applied to an image display device according to an embodiment. The image display device according to this embodiment is configured the same as the image display devices according to the embodiments explained above except that an image display panel 93 shown in FIG. 9 is applied.

In the image display panel 93, organic EL elements 96 for image display are formed as organic EL elements of the bottom emission type and an organic EL element 96D for monitoring is formed as an organic EL element of the top emission type. Therefore, although the light emitting element 7 is arranged on the rear surface of the emission surface, the image display panel 93 is different from the image display panels according to the embodiments explained above in that the rear surface is a surface of the upper substrate 14 side. The image display panel 93 is formed the same as the image display panels according to the embodiments explained above except that configurations concerning the organic EL elements 96 and 96D are different form those of the image display panels according to the embodiments.

More specifically, in the organic EL elements 96 for image display, the lower electrodes 11 and the upper electrodes 13 are respectively formed by transparent electrodes and reflective electrodes. In the organic EL element 96D for monitoring, the lower electrode 11D and the upper electrode 13D are respectively formed by a reflective electrode and a transparent electrode. In FIG. 9, the transparent electrodes and the reflective electrodes are formed by the method of forming electrodes in the image display device explained with reference to FIG. 2. However, as the method of forming the transparent electrodes and the reflective electrodes, the various forming methods explained concerning the first to sixth embodiments can be applied.

According to this embodiment, even when the organic EL elements for image display and the organic EL element for monitoring are respectively formed as organic EL elements of the bottom emission type and an organic EL element of the top emission type, it is possible to obtain effects same as those in the embodiments explained above.

Ninth Embodiment

FIG. 10 is a sectional view of an image display panel applied to an image display device according to an embodiment shown in comparison with FIG. 9. The image display device according to this embodiment is configured the same as the image display device according to the eighth embodiment except that an image display panel 103 shown in FIG. 10 is applied.

The image display panel 103 is configured the same as the image display panel 93 according to an embodiment except that an organic EL element 106D for monitoring is arranged instead of the organic EL element 96D for monitoring. The organic EL element 106D for monitoring is configured the same as the organic EL element 96D except that the lower electrode 11D is formed in the same process and the same manner as the lower electrodes 11 of the organic EL elements 96 for image display.

Therefore, in the image display panel 103, the organic EL element 106D for monitoring emits emission light to an emission surface and a rear surface of the emission surface as indicated by reference signs L1DU and L1DD and the light receiving element 7 receives the monitoring light L1DD emitted to the rear surface side.

According to this embodiment, even if the organic EL elements for image display are formed as organic EL elements of the bottom emission type and the monitoring light is also emitted to the emission surface side, effects same as those of the embodiments explained above can be obtained.

Modifications

In the embodiments explained above, the organic EL elements of the image display unit are driven by the active system. However, the present application is not limited to this. The organic EL elements may be driven by the passive system.

In the embodiments explained above, the monitoring light is received by the light receiving element and subjected to the luminance adjustment. However, the present application is not limited to this and can be widely applied even when the luminance adjustment is performed by using the organic EL element for monitoring without using the light receiving element by applying, for example, the method disclosed in JP-A-2006-11388.

In the embodiments explained above, the present application is applied to the image display device including the organic EL elements. However, the present application is not limited to this and can be widely applied to image display devices including various self-light emitting elements of the current driving type.

The present application can be applied to an active matrix image display device employing self-light emitting elements such as organic EL elements.

It should be understood that various changes and modifications to the presently preferred embodiments described herein will be apparent to those skilled in the art. Such changes and modifications can be made without departing from the spirit and scope and without diminishing its intended advantages. It is therefore intended that such changes and modifications be covered by the appended claims.

The application is claimed as follows:

1. An image display panel comprising:
   a lower substrate;
   self-light emitting elements for image display that are arranged on the lower substrate in a matrix shape and form an image display unit;
   a self-light emitting element for monitoring that is arranged on the lower substrate and emits monitoring light for the image display unit; and
   an upper substrate that holds the self-light emitting elements for image display and the self-light emitting element for monitoring in conjunction with the lower substrate,
   wherein either
   (a) the self-light emitting elements for image display are organic EL elements of a top emission type, and the self-light emitting element for monitoring is at least an organic EL element of a bottom emission type, or
   (b) the self-light emitting elements for image display are organic EL elements of a bottom emission type, and the self-light emitting element for monitoring is at least an organic EL element of a top emission type,
   such that the image display panel includes self-light emitting elements for image display and for monitoring that have opposite emission directions for display and monitoring.

2. An image display panel according to claim 1, wherein the self-light emitting elements for image display are organic EL elements of a top emission type, and the self-light emitting element for monitoring is an organic EL element of a bottom emission type.

3. An image display panel according to claim 2, wherein the self-light emitting elements for image display are formed by sequentially laminating lower electrodes formed by sequentially laminating reflective electrodes and transparent electrodes and upper electrodes including organic EL layers and transparent electrodes, and the self-light emitting element for monitoring is formed by sequentially laminating a lower electrode including a transparent electrode and an upper electrode formed by sequentially laminating an organic EL layer, a transparent electrode, and a reflective electrode.

4. An image display panel according to claim 1, wherein the self-light emitting elements for image display are organic EL elements of a bottom emission type, and the self-light emitting element for monitoring is at least an organic EL element of a top emission type.

5. An image display panel according to claim 4, wherein the self-light emitting elements for image display are formed by sequentially laminating lower electrodes including transparent electrodes and upper electrodes formed by sequentially laminating organic EL layers, transparent electrodes, and reflective electrodes, and the self-light emitting element for monitoring is formed by sequentially laminating a lower electrode formed by sequentially laminating a reflective electrode and a transparent electrode and an upper electrode including an organic EL layer and a transparent electrode.

6. An image display panel comprising:
   a lower substrate;
   self-light emitting elements for image display that are arranged on the lower substrate in a matrix shape and form an image display unit;
   a self-light emitting element for monitoring that is arranged on the lower substrate and emits monitoring light for the image display unit; and
   an upper substrate that holds the self-light emitting elements for image display and the self-light emitting element for monitoring in conjunction with the lower substrate,
   wherein either
   (a) the self-light emitting elements for image display are organic EL elements of a top emission type, and the self-light emitting element for monitoring is at least an organic EL element of a bottom emission type, or
   (b) the self-light emitting elements for image display are organic EL elements of a bottom emission type, and the self-light emitting element for monitoring is at least an organic EL element of a top emission type,
   such that the image display panel includes self-light emitting elements for image display and for monitoring that have opposite emission directions for display and monitoring, and
   a light receiving element that receives the monitoring light is provided.

7. An image display panel according to claim 6, wherein the self-light emitting elements for image display are organic EL elements of the top emission type, and the self-light emitting element for monitoring is an organic EL element of the bottom emission type.

8. An image display device comprising:
   an image display panel that displays image data; and
   a luminance correcting unit that corrects light emission luminance of the image display panel on the basis of a light reception result of the light receiving element provided in the image display panel,
   wherein the image display panel includes
   a lower substrate,
   self-light emitting elements for image display that are arranged on the lower substrate in a matrix shape and form an image display unit,
   a self-light emitting element for monitoring that is arranged on the lower substrate and emits monitoring light for the image display unit, and an upper substrate that holds the self-light emitting elements for image display and the self-light emitting element for monitoring in conjunction with the lower substrate, wherein either
   (a) the self-light emitting elements for image display are organic EL elements of a top emission type, and the self-light emitting element for monitoring is at least an organic EL element of a bottom emission type, or
   (b) the self-light emitting elements for image display are organic EL elements of a bottom emission type, and the self-light emitting element for monitoring is at least an organic EL element of a top emission type,
   such that the image display device includes self-light emitting elements for image display and for monitoring that have opposite emission directions for display and monitoring, and
wherein the light receiving element that receives the monitoring light is provided.

9. An image display device according to claim 8, wherein the self-light emitting elements for image display are organic EL elements of the top emission type, and
the self-light emitting element for monitoring is an organic EL element of the bottom emission type.

10. A manufacturing method for an image display panel including
   a lower substrate,
   self-light emitting elements for image display that are arranged on the lower substrate in a matrix shape and form an image display unit,
   a self-light emitting element for monitoring that is arranged on the lower substrate and emits monitoring light for the image display unit, and
   an upper substrate that holds the self-light emitting elements for image display and the self-light emitting element for monitoring in conjunction with the lower substrate,
   wherein either
      (a) the self-light emitting elements for image display are organic EL elements of a top emission type, and the self-light emitting element for monitoring is at least an organic EL element of a bottom emission type, or
      (b) the self-light emitting elements for image display are organic EL elements of a bottom emission type, and the self-light emitting element for monitoring is at least an organic EL element of a top emission type,
      such that the image display panel includes self-light emitting elements for image display and for monitoring that have opposite emission directions for display and monitoring,
   the manufacturing method comprising the steps of:
   forming lower electrodes of the self-light emitting elements for image display and the self-light emitting element for monitoring on the lower substrate;
   forming organic EL layers of the self-light emitting elements for image display and the self-light emitting element for monitoring on the lower electrode; and
   forming upper electrodes of the self-light emitting elements for image display and the self-light emitting element for monitoring on the organic EL layers, wherein
   the step of forming lower electrodes includes the steps of
   forming reflective electrodes of the self-light emitting elements for image display on the lower substrate; and
   forming a transparent electrode of the self-light emitting element for monitoring on the lower substrate.

11. A manufacturing method for an image display panel including
   a lower substrate,
   self-light emitting elements for image display that are arranged on the lower substrate in a matrix shape and form an image display unit,
   a self-light emitting element for monitoring that is arranged on the lower substrate and emits monitoring light for the image display unit, and
   an upper substrate that holds the self-light emitting elements for image display and the self-light emitting element for monitoring in conjunction with the lower substrate,
   wherein either
      (a) the self-light emitting elements for image display are organic EL elements of a top emission type, and the self-light emitting element for monitoring is at least an organic EL element of a bottom emission type, or
      (b) the self-light emitting elements for image display are organic EL elements of a bottom emission type, and the self-light emitting element for monitoring is at least an organic EL element of a top emission type,
      such that the image display panel includes self-light emitting elements for image display and for monitoring that have opposite emission directions for display and monitoring,
   the manufacturing method comprising the steps of:
   forming lower electrodes of the self-light emitting elements for image display and the self-light emitting element for monitoring on the lower substrate;
   forming organic EL layers of the self-light emitting elements for image display and the self-light emitting element for monitoring on the lower electrode; and
   forming upper electrodes of the self-light emitting elements for image display and the self-light emitting element for monitoring on the organic EL layers, wherein
   the step of forming upper electrodes includes the steps of
   forming transparent electrodes on the organic EL layers of the self-light emitting elements for image display and the self-light emitting element for monitoring; and
   forming a reflective electrode of the transparent electrode of the self-light emitting element for monitoring.

12. A manufacturing method for an image display panel including
   a lower substrate,
   self-light emitting elements for image display that are arranged on the lower substrate in a matrix shape and form an image display unit,
   a self-light emitting element for monitoring that is arranged on the lower substrate and emits monitoring light for the image display unit, and
   an upper substrate that holds the self-light emitting elements for image display and the self-light emitting element for monitoring in conjunction with the lower substrate,
   wherein either
      (a) the self-light emitting elements for image display are organic EL elements of a top emission type, and the self-light emitting element for monitoring is at least an organic EL element of a bottom emission type, or
      (b) the self-light emitting elements for image display are organic EL elements of a bottom emission type, and the self-light emitting element for monitoring is at least an organic EL element of a top emission type,
      such that the image display panel includes self-light emitting elements for image display and for monitoring that have opposite emission directions for display and monitoring, the manufacturing method comprising the steps of:
forming lower electrodes of the self-light emitting elements for image display and the self-light emitting element for monitoring on the lower substrate;
forming organic EL layers of the self-light emitting elements for image display and the self-light emitting element for monitoring on the lower electrode; and
forming upper electrodes of the self-light emitting elements for image display and the self-light emitting element for monitoring on the organic EL layers, wherein
in the step of forming organic EL layers, all or a part of plural organic layers forming the organic EL layers are formed by the self-light emitting elements for image display and the self-light emitting element for monitoring in the same process.

13. A manufacturing method for an image display panel including
a lower substrate,
self-light emitting elements for image display that are arranged on the lower substrate in a matrix shape and form an image display unit,
a self-light emitting element for monitoring that is arranged on the lower substrate and emits monitoring light for the image display unit, and
an upper substrate that holds the self-light emitting elements for image display and the self-light emitting element for monitoring in conjunction with the lower substrate,
wherein either
  (a) the self-light emitting elements for image display are organic EL elements of a top emission type, and the self-light emitting element for monitoring is at least an organic EL element of a bottom emission type, or
  (b) the self-light emitting elements for image display are organic EL elements of a bottom emission type, and the self-light emitting element for monitoring is at least an organic EL element of a top emission type,
  such that the image display panel includes self-light emitting elements for image display and for monitoring that have opposite emission directions for display and monitoring,
the manufacturing method comprising the steps of:
forming lower electrodes of the self-light emitting elements for image display and the self-light emitting element for monitoring on the lower substrate;
forming organic EL layers of the self-light emitting elements for image display and the self-light emitting element for monitoring on the lower electrode; and
forming upper electrodes of the self-light emitting elements for image display and the self-light emitting element for monitoring on the organic EL layers, wherein
the step of forming lower electrodes includes the steps of
forming a reflective electrode of the self-light emitting element for monitoring on the lower substrate; and
forming a transparent electrode on the reflective electrode of the self-light emitting element for monitoring and forming transparent electrodes of the self-light emitting elements for image display on the lower substrate.

14. A manufacturing method for an image display panel including
a lower substrate,
self-light emitting elements for image display that are arranged on the lower substrate in a matrix shape and form an image display unit,
a self-light emitting element for monitoring that is arranged on the lower substrate and emits monitoring light for the image display unit, and
an upper substrate that holds the self-light emitting elements for image display and the self-light emitting element for monitoring in conjunction with the lower substrate,
wherein either
  (a) the self-light emitting elements for image display are organic EL elements of a top emission type, and the self-light emitting element for monitoring is at least an organic EL element of a bottom emission type, or
  (b) the self-light emitting elements for image display are organic EL elements of a bottom emission type, and the self-light emitting element for monitoring is at least an organic EL element of a top emission type,
  such that the image display panel includes self-light emitting elements for image display and for monitoring that have opposite emission directions for display and monitoring,
the manufacturing method comprising the steps of:
forming lower electrodes of the self-light emitting elements for image display and the self-light emitting element for monitoring on the lower substrate;
forming organic EL layers of the self-light emitting elements for image display and the self-light emitting element for monitoring on the lower electrode; and
forming upper electrodes of the self-light emitting elements for image display and the self-light emitting element for monitoring on the organic EL layers, wherein
the step of forming upper electrodes includes the steps of
forming transparent electrodes on the organic EL layers of the self-light emitting elements for image display and the self-light emitting element for monitoring; and
forming reflective electrodes on the transparent electrodes of the self-light emitting elements for image display.

15. A manufacturing method for an image display panel including
a lower substrate,
self-light emitting elements for image display that are arranged on the lower substrate in a matrix shape and form an image display unit,
a self-light emitting element for monitoring that is arranged on the lower substrate and emits monitoring light for the image display unit, and
an upper substrate that holds the self-light emitting elements for image display and the self-light emitting element for monitoring in conjunction with the lower substrate,
wherein either
  (a) the self-light emitting elements for image display are organic EL elements of a top emission type, and the self-light emitting element for monitoring is at least an organic EL element of a bottom emission type, or
  (b) the self-light emitting elements for image display are organic EL elements of a bottom emission type, and the self-light emitting element for monitoring is at least an organic EL element of a top emission type,
  such that the image display panel includes self-light emitting elements for image display and for monitoring that have opposite emission directions for display and monitoring,
the manufacturing method comprising the steps of:
forming lower electrodes of the self-light emitting elements for image display and the self-light emitting element for monitoring on the lower substrate;
forming organic EL layers of the self-light emitting elements for image display and the self-light emitting element for monitoring on the lower electrode; and forming upper electrodes of the self-light emitting elements for image display and the self-light emitting element for monitoring on the organic EL layers, wherein in the step of forming organic EL layers, all or a part of plural organic layers forming the organic EL layers are formed by the self-light emitting elements for image display and the self-light emitting element for monitoring in the same process.

* * * * *